United States Patent
Kapinos et al.

(10) Patent No.: US 11,520,386 B2
(45) Date of Patent: Dec. 6, 2022

(54) FAN MOTOR FOR WIRELESS CHARGING

(71) Applicant: Lenovo (Singapore) Pte. Ltd., Singapore (SG)

(72) Inventors: Robert J. Kapinos, Durham, NC (US); Scott Wentao Li, Cary, NC (US); Robert James Norton, Jr., Raleigh, NC (US); Russell Speight Vanblon, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 74 days.

(21) Appl. No.: 17/214,140

(22) Filed: Mar. 26, 2021

(65) Prior Publication Data

US 2022/0308644 A1  Sep. 29, 2022

(51) Int. Cl.
*G06F 1/20* (2006.01)
*H02J 50/00* (2016.01)
*H02J 50/12* (2016.01)
*H05K 7/20* (2006.01)

(52) U.S. Cl.
CPC ............ *G06F 1/203* (2013.01); *H02J 50/005* (2020.01); *H02J 50/12* (2016.02); *H05K 7/20172* (2013.01)

(58) Field of Classification Search
CPC .. H02J 7/025; H02J 50/12; H02J 50/10; H02J 7/00034; H02J 5/005; H02J 7/0044; H02J 50/005; H02J 13/00022; G06F 1/26; G06F 1/203; G06F 3/044; G06F 1/20; G06F 21/35; G06F 1/1613; G06F 1/189; H05K 7/20172
See application file for complete search history.

(56) References Cited

U.S. PATENT DOCUMENTS

| | | | | |
|---|---|---|---|---|
| 5,135,363 A | * | 8/1992 | Harmsen | F04D 25/0606 417/423.1 |
| 6,194,798 B1 | * | 2/2001 | Lopatinsky | F04D 29/327 310/63 |
| 6,388,346 B1 | * | 5/2002 | Lopatinsky | H02K 1/2753 417/423.1 |
| 6,527,522 B2 | * | 3/2003 | Chen | F04D 25/066 417/423.1 |
| 6,606,578 B1 | * | 8/2003 | Henderson | B64D 27/24 702/145 |
| 6,670,737 B2 | * | 12/2003 | Chen | H02K 7/14 310/194 |
| 6,896,492 B2 | * | 5/2005 | Masterton | F04D 25/066 310/68 B |

(Continued)

FOREIGN PATENT DOCUMENTS

| | | | |
|---|---|---|---|
| CN | 208236712 U | * 12/2018 | |
| EP | 3382499 A2 | * 10/2018 | G06F 1/1632 |

OTHER PUBLICATIONS

"European Application Serial No. 22158752.0, European Search Report dated Aug. 11, 2022", 6 pgs.

*Primary Examiner* — Michael A Matey
(74) *Attorney, Agent, or Firm* — Schwegman Lundberg & Woessner, P.A.

(57) ABSTRACT

An electronic device includes a case for housing electronics. A fan is supported within the case. The fan includes a motor configured to drive fan blades and to generate an electromagnetic charging field. The motor is positioned to provide the charging field to an open area outside the case comprising a charging pad.

17 Claims, 3 Drawing Sheets

(56) References Cited

U.S. PATENT DOCUMENTS

| | | | |
|---|---|---|---|
| 10,718,339 B2* | 7/2020 | Patton | G06F 1/203 |
| 2006/0044757 A1* | 3/2006 | Hsu | H05K 7/20172 |
| | | | 361/695 |
| 2006/0120063 A1* | 6/2006 | Lai | F04D 25/06 |
| | | | 362/253 |
| 2012/0119608 A1* | 5/2012 | Chen | H02K 21/24 |
| | | | 310/208 |
| 2014/0191598 A1* | 7/2014 | Winheim | H02K 11/33 |
| | | | 310/71 |
| 2014/0191717 A1* | 7/2014 | Hong | H02J 50/12 |
| | | | 320/108 |
| 2016/0241046 A1* | 8/2016 | Lee | H02J 50/12 |
| 2018/0284842 A1* | 10/2018 | Han | H04M 1/04 |
| 2019/0013712 A1* | 1/2019 | Kim | F04D 25/08 |
| 2019/0115129 A1* | 4/2019 | Kim | H01F 5/003 |
| 2019/0115781 A1* | 4/2019 | Feng | H02J 50/12 |
| 2020/0057469 A1* | 2/2020 | Choi | H04M 1/21 |
| 2020/0091755 A1* | 3/2020 | Larsson | H01F 27/2876 |
| 2020/0201402 A1 | 6/2020 | Lee et al. | |
| 2022/0069595 A1* | 3/2022 | Yu | G06F 1/1628 |

\* cited by examiner

FAN MOTOR FOR WIRELESS CHARGING

BACKGROUND

Small thin personal computers have little if any spare space inside for additional components. While close-contact wireless charging is a popular feature, such small thin personal computers lack room for any wireless charging circuitry.

SUMMARY

An electronic device computer has a combined wireless charging pad and fan motor according to an example embodiment. The fan motor is used to create an electromagnetic field close to a surface of the electronic device such that the surface can be used to charge a battery powered device.

DETAILED DESCRIPTION

Figure 1:
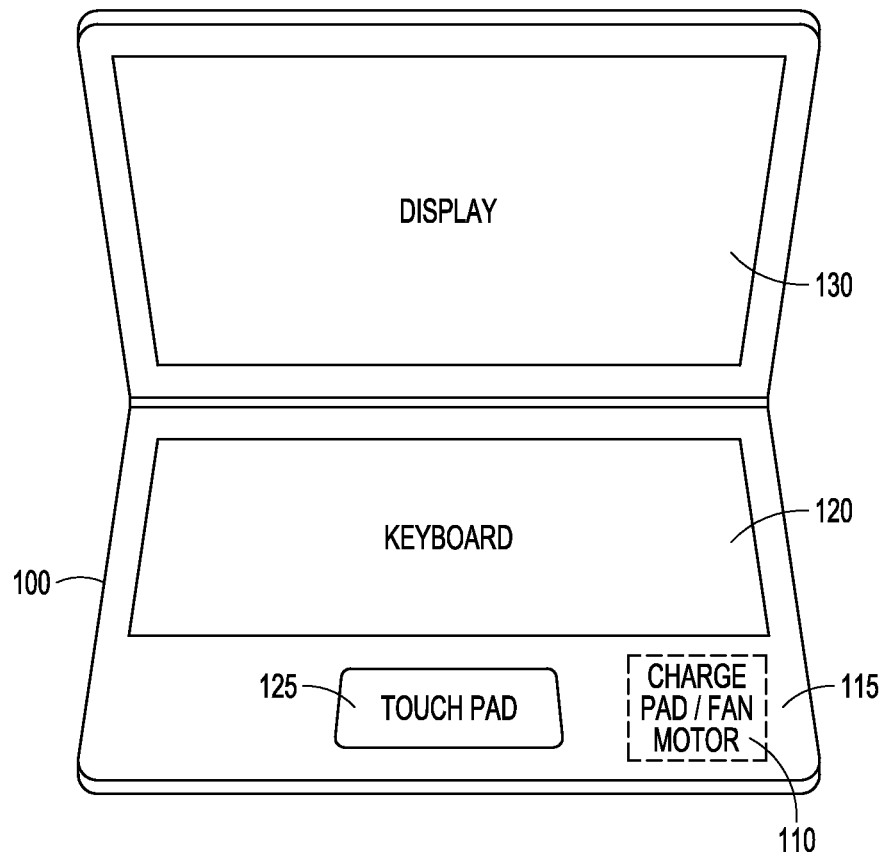
FIG. 1 is a block diagram of a personal computer having a combined wireless charging pad and fan motor according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software in one embodiment. The software may consist of computer executable instructions stored on computer readable media or computer readable storage device such as one or more non-transitory memories or other type of hardware based storage devices, either local or networked. Further, such functions correspond to modules, which may be software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system, turning such computer system into a specifically programmed machine.

The functionality can be configured to perform an operation using, for instance, software, hardware, firmware, or the like. For example, the phrase "configured to" can refer to a logic circuit structure of a hardware element that is to implement the associated functionality. The phrase "configured to" can also refer to a logic circuit structure of a hardware element that is to implement the coding design of associated functionality of firmware or software. The term "module" refers to a structural element that can be implemented using any suitable hardware (e.g., a processor, among others), software (e.g., an application, among others), firmware, or any combination of hardware, software, and firmware. The term, "logic" encompasses any functionality for performing a task. For instance, each operation illustrated in the flowcharts corresponds to logic for performing that operation. An operation can be performed using, software, hardware, firmware, or the like. The terms, "component," "system," and the like may refer to computer-related entities, hardware, and software in execution, firmware, or combination thereof. A component may be a process running on a processor, an object, an executable, a program, a function, a subroutine, a computer, or a combination of software and hardware. The term, "processor," may refer to a hardware component, such as a processing unit of a computer system.

Furthermore, the claimed subject matter may be implemented as a method, apparatus, or article of manufacture using standard programming and engineering techniques to produce software, firmware, hardware, or any combination thereof to control a computing device to implement the disclosed subject matter. The term, "article of manufacture," as used herein is intended to encompass a computer program accessible from any computer-readable storage device or media. Computer-readable storage media can include, but are not limited to, magnetic storage devices, e.g., hard disk, floppy disk, magnetic strips, optical disk, compact disk (CD), digital versatile disk (DVD), smart cards, flash memory devices, among others. In contrast, computer-readable media, i.e., not storage media, may additionally include communication media such as transmission media for wireless signals and the like.

Most thin computers already contain a flat, variable speed exhaust fan motor. The coils in such a motor create the same kinds of alternating electrical field as wireless charging circuits. The difference is that the frequency varies in the motor at about 5 khz, and wireless charging works at about 140 khz.

With a small amount of physical rearrangement the inductive field coils from the motor are exposed as a charging pad. The windings on that side are altered to emit a higher frequency electrical field through a phase locked loop or through secondary interaction of the magnetic drive field with circumferential magnets.

FIG. 1 is a block diagram of a device 100 having a combined wireless charging pad and fan motor, referred to as charging pad 110 (represented by a broken line) placed beneath an open area 115 on a top interactive side of device 100. Device 100 may be a laptop computer in some embodiments, and include a keyboard 120, touchpad 125, and display 130. Other devices having limited internal space yet an open area on a surface that is suitable for coming in close contact with a device to be wirelessly charged may alternatively make use of a combined wireless charging pad and fan motor. Placing the combined wireless charging pad and fan motor near the top interactive surface, allows the device 100 to be used while at the same time charging a battery powered device.

In various embodiments, the combined wireless charging pad and fan motor 110 may be less than 5 cm in diameter.

Figure 2:
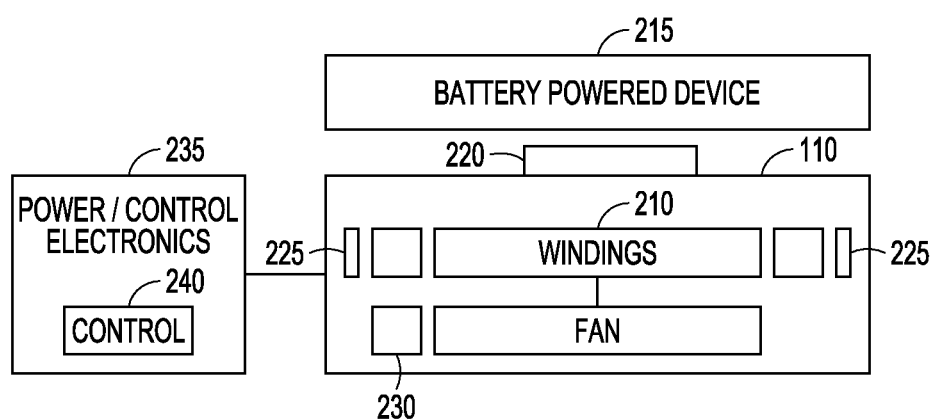
FIG. 2 is a block diagram of the combined wireless charging pad and fan motor of FIG. 1 according to an example embodiment.

FIG. 2 is a block diagram of the combined wireless charging pad and fan motor 110 of FIG. 1 according to an example embodiment. Portions of the combined wireless charging pad and fan motor 110 that emit electromagnetic fields are placed towards the top side of device 100 instead of a board side in one embodiment to bring the emitted fields closer to the top side in open area 115.

In one embodiment, the portions that emit electromagnetic fields comprise coil windings 210 of a rotor or stator. The motor drives fan blades indicated at 212. Note that the fan blades are shown below the windings 210, but may also be laterally spaced in a same plane about the windings in further embodiments. In one embodiment, the coil windings 210 are increased to increase the field to enough to simultaneously turn the fan motor and to charge a device 215 positioned proximate the windings 210. Additional circumferentially disposed magnets 217 may be added to emit a higher frequency electrical field via interaction with the magnetic field created by the windings 210.

A detection plate 220 may be added on or near the case to detect the presence of device 215 to be charged when placed near the charging pad 110.

An inductive soft iron plate 225 may be added near the motor coil to create the charging resonance.

A backscatter modulation detector 230 may be added at the base of the motor power circuit.

In some embodiments, the motor and charger cannot run simultaneously. In these cases, a mode control implemented by a power controller and electronics circuitry 235 may control which runs based on need for cooling weighed against the need for charging, which cooling needs taking precedence.

Circuitry 235 may also run variable speed control software 240 that runs the motor to increase the current and overlay a high frequency AC signal into the low-frequency motor driving DC when charging to obtain charging frequencies of approximately between about 110 and 205 kHz for the low power charging up to 5 watts and 80-300 kHz for the medium power charging. In one embodiment, circuitry 235 includes a phase locked loop to cause emission of desired charging frequencies from the windings 210.

In a further embodiment, detection plate 220 provides an indication to the electronics 235 to indicate that the battery powered device 215 is in position for charging. The electronics 235 may then enter a charging mode to increase the speed of the motor to generate the desired frequency of electromagnetic field for charging the battery powered device 215.

Figure 3:
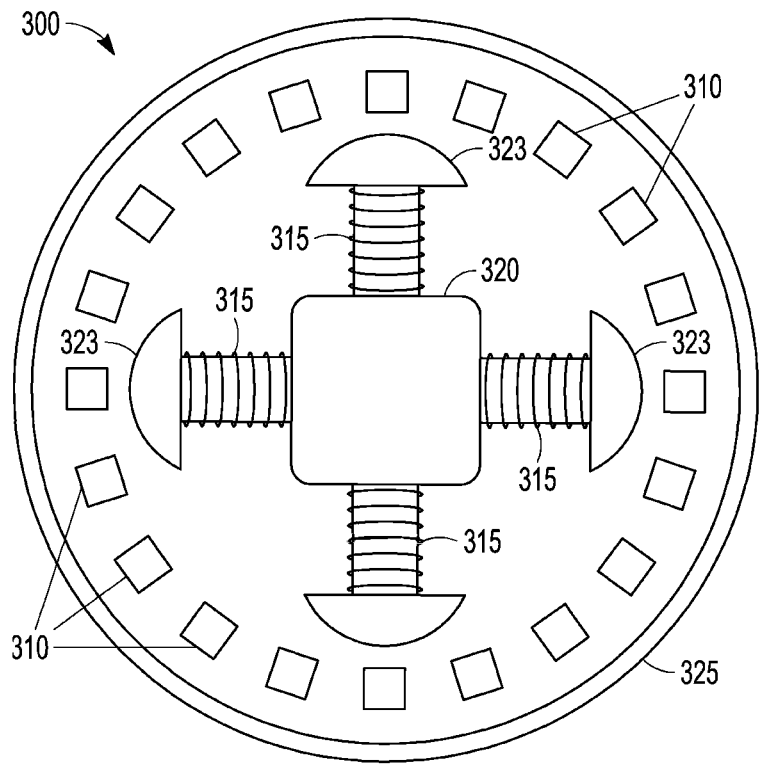
FIG. 3 is a top view block diagram of a fan motor having additional magnets for creating a charging electromagnetic field according to an example embodiment.

FIG. 3 is a top view block diagram of a fan motor 300 having a series magnets 310 arranged circumferentially around windings 315 to generate a suitable electromagnetic field for charging a battery powered device. In one embodiment, motor 300 is shown as having a two-phase brushless motor stator 320 supporting the windings.

In one embodiment, the coils are placed on the stator 320 of the motor. In a further embodiment, the circumferential series of magnets 310 may be placed around the rotor of the motor. In further embodiments, the charging pad 110 may be placed on a back side of the electronic device 100.

An inductive plate, such as an inductive soft iron plate 325 is added near or around the motor 300 to direct the generated charging field to the charging pad.

Figure 4:
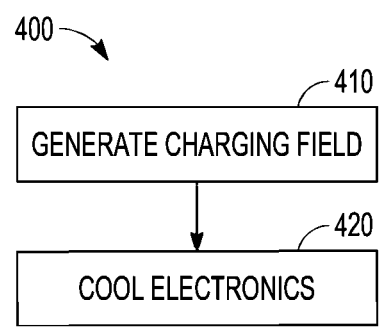
FIG. 4 is a flowchart illustrating a method for cooling an electronic device and generating a charging field via a cooling fan motor according to an example embodiment.

FIG. 4 is a flowchart illustrating a method 400 for cooling an electronic device and generating a charging field via a cooling fan motor according to an example embodiment. Method 400 includes generating an electromagnetic charging field at 410 with a cooling fan motor disposed within an electronic device. The electromagnetic field is directed to a charging area on a surface of a case containing electronics of the electronic device. At 420, a fan coupled to the cooling fan motor is driven to also cool the electronics.

In one embodiment, the cooling fan motor is controlled between a first mode having a low frequency for driving the fan and a second mode having a higher frequency for generating the electromagnetic charging field. The low frequency is approximately 5 KHz, and the higher frequency is greater than 80 KHz.

In one embodiment, the electromagnetic charging field is generated via a series of magnets circumferentially disposed about a stator of the cooling fan motor. The field may be directed to the charging area by an inductive plate positioned about the cooling fan motor.

The presence of a battery powered device on the charging area may be detected prior to generating the charging field.

Figure 5:
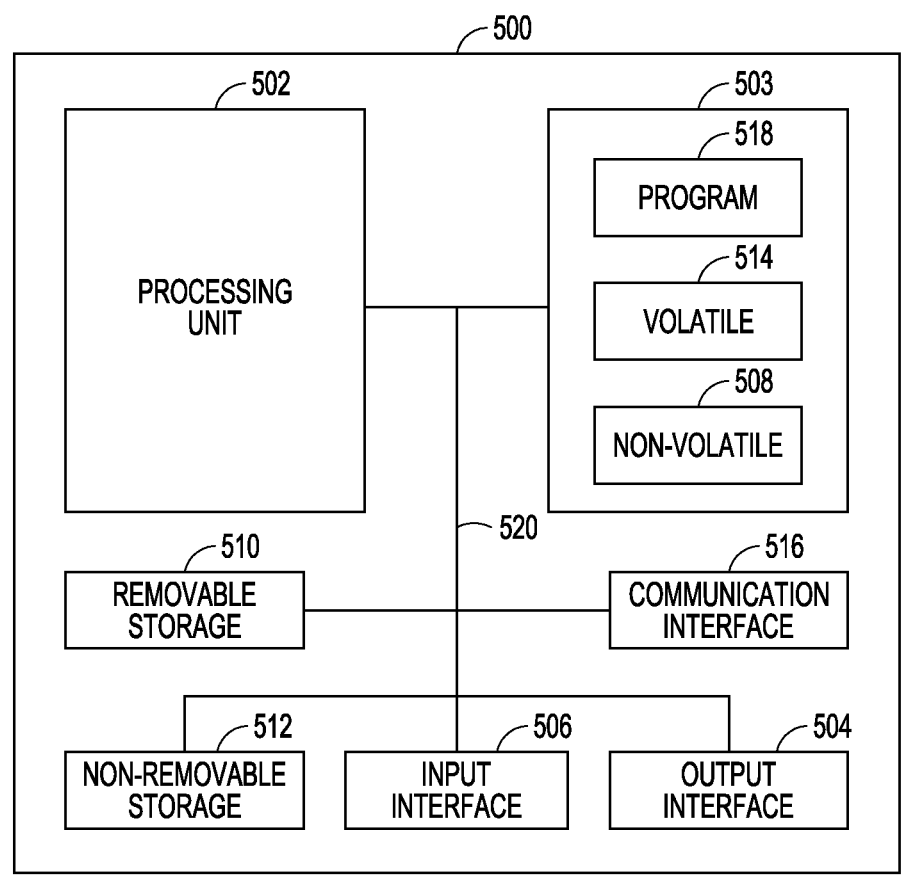
FIG. 5 is a block schematic diagram of a computer system to implement one or more example embodiments.

FIG. 5 is a block schematic diagram of a computer system 500 to implement control actions and circuitry for controlling a fan motor to also or alternatively operate as a wireless charging device and for performing methods and algorithms according to example embodiments. All components need not be used in various embodiments.

One example computing device in the form of a computer 500 may include a processing unit 502, memory 503, removable storage 510, and non-removable storage 512. Although the example computing device is illustrated and described as computer 500, the computing device may be in different forms in different embodiments. For example, the computing device may instead be a smartphone, a tablet, smartwatch, smart storage device (SSD), or other computing device including the same or similar elements as illustrated and described with regard to FIG. 5. Devices, such as smartphones, tablets, and smartwatches, are generally collectively referred to as mobile devices or user equipment.

Although the various data storage elements are illustrated as part of the computer 500, the storage may also or alternatively include cloud-based storage accessible via a network, such as the Internet or server-based storage. Note also that an SSD may include a processor on which the parser may be run, allowing transfer of parsed, filtered data through I/O channels between the SSD and main memory.

Memory 503 may include volatile memory 514 and non-volatile memory 508. Computer 500 may include—or have access to a computing environment that includes—a variety of computer-readable media, such as volatile memory 514 and non-volatile memory 508, removable storage 510 and non-removable storage 512. Computer storage includes random access memory (RAM), read only memory (ROM), erasable programmable read-only memory (EPROM) or electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions.

Computer 500 may include or have access to a computing environment that includes input interface 506, output interface 504, and a communication interface 516. Output interface 504 may include a display device, such as a touchscreen, that also may serve as an input device. The input interface 506 may include one or more of a touchscreen, touchpad, mouse, keyboard, camera, one or more device-specific buttons, one or more sensors integrated within or coupled via wired or wireless data connections to the computer 500, and other input devices. The computer may operate in a networked environment using a communication connection to connect to one or more remote computers, such as database servers. The remote computer may include a personal computer (PC), server, router, network PC, a peer device or other common data flow network switch, or the like. The communication connection may include a Local Area Network (LAN), a Wide Area Network (WAN), cellular, Wi-Fi, Bluetooth, or other networks. According to one embodiment, the various components of computer 500 are connected with a system bus 520.

Computer-readable instructions stored on a computer-readable medium are executable by the processing unit 502 of the computer 500, such as a program 518. The program 518 in some embodiments comprises software to implement one or more methods described herein. A hard drive, CD-ROM, and RAM are some examples of articles including a non-transitory computer-readable medium such as a storage device. The terms computer-readable medium, machine readable medium, and storage device do not include carrier waves or signals to the extent carrier waves and signals are deemed too transitory. Storage can also include networked storage, such as a storage area network (SAN). Computer program 518 along with the workspace manager 522 may be used to cause processing unit 502 to perform one or more methods or algorithms described herein.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. An electronic device comprising: a case for housing electronics; a fan supported within the case, the fan including: a motor configured to drive fan blades and to generate an electromagnetic charging field, the motor positioned to provide the charging field to an open area outside the case comprising a charging pad, and a phase lock loop electronics to control a frequency of the electromagnetic charging field.

2. The device of claim 1 and further comprising a series of magnets circumferentially disposed about a stator of the motor to generate the charging field.

3. The device of claim 1 and further comprising a controller to control a speed of the motor to generate the charging field.

4. The device of claim 3 wherein the controller controls a mode of the motor to either operate in a cooling mode or a charging mode.

5. The device of claim 4 wherein the cooling mode has a frequency of about 5 KHz and the charging mode has a frequency greater than 80 KHz.

6. The device of claim 1 wherein the charging field has a frequency of between 80 to 300 KHz.

7. The device of claim 1 and further comprising an inductive iron plate disposed about coil windings of the motor to create a charging resonance with a device being charged.

8. The device of claim 1 and further comprising a detection plate to detect a device to be charged.

9. The device of claim 1 wherein the motor comprises coil windings having an increased number of windings to generate the charging field.

10. The device of claim 1 and further comprising a backscatter modulation detector supported at a base of the motor.

11. A method comprising: generating an electromagnetic charging field with a cooling fan motor disposed within an electronic device, the electromagnetic field directed to a charging area on a surface of a case containing electronics of the electronic device; driving a fan coupled to the cooling fan motor to cool the electronics, and controlling the cooling fan motor between a first mode having a low frequency for driving the fan and a second mode having a higher frequency for generating the electromagnetic charging field.

12. The method of claim 11 wherein the low frequency is approximately 5 KHz, and the higher frequency is greater than 80 KHz.

13. The method of claim 11 wherein the electromagnetic charging field is generated via a series of magnets circumferentially disposed about a stator of the cooling fan motor.

14. The method of claim 11 wherein the electromagnetic charging field is directed to the charging area by an inductive plate positioned about the cooling fan motor.

15. The method of claim 11 and further comprising detecting the presence of a battery powered device on the charging area prior to generating the charging field.

16. A device comprising: a processor; and a memory device coupled to the processor and having a program stored thereon for execution by the processor to perform operations comprising: generating an electromagnetic charging field with a cooling fan motor disposed within an electronic device, the electromagnetic field directed to a charging area on a surface of a case containing electronics of the electronic device; and driving a fan coupled to the cooling fan motor to cool the electronics, wherein the operations further comprise controlling the cooling fan motor between a first mode having a low frequency for driving the fan and a second mode having a higher frequency for generating the electromagnetic charging field.

17. The device of claim 16 wherein the low frequency is approximately 5 KHz, and the higher frequency is greater than 80 KHz.

* * * * *